(12) United States Patent
Do et al.

(10) Patent No.: US 12,273,642 B2
(45) Date of Patent: Apr. 8, 2025

(54) DUAL-MODE COLUMN AMPLIFIER

(71) Applicant: Fairchild Imaging, Inc., San Jose, CA (US)

(72) Inventors: Hung Trong Do, San Jose, CA (US); Khai Nguyen, Stockton, CA (US); Stephen W. Mims, San Diego, CA (US); Alexander Lu, San Jose, CA (US); Kwang Bo Cho, San Jose, CA (US); Angel Rogelio Lopez, Newark, CA (US)

(73) Assignee: FAIRCHILD IMAGING, INC., Wilmington, DE (US)

( * ) Notice: Subject to any disclaimer, the term of this patent is extended or adjusted under 35 U.S.C. 154(b) by 62 days.

(21) Appl. No.: 18/063,885

(22) Filed: Dec. 9, 2022

(65) Prior Publication Data
US 2024/0196115 A1  Jun. 13, 2024

(51) Int. Cl.
*H04N 25/76* (2023.01)
*H03F 3/45* (2006.01)
*H04N 25/768* (2023.01)
*H04N 25/78* (2023.01)

(52) U.S. Cl.
CPC ....... *H04N 25/768* (2023.01); *H03F 3/45269* (2013.01); *H04N 25/78* (2023.01)

(58) Field of Classification Search
CPC ... H04N 25/768; H04N 25/78; H03F 3/45269
See application file for complete search history.

(56) References Cited

U.S. PATENT DOCUMENTS

| | | |
|---|---|---|
| 5,917,547 A | 6/1999 | Merrill et al. |
| 5,923,369 A | 7/1999 | Merrill et al. |
| 6,844,897 B1 | 1/2005 | Andersson |
| 6,914,631 B2 | 7/2005 | Udo et al. |
| 7,667,753 B2 | 2/2010 | Segura-Puchades |
| 7,800,676 B2 | 9/2010 | Mentzer |
| 8,212,200 B2 | 7/2012 | Boemler |
| 8,896,733 B2 | 11/2014 | Solhusvik |
| 9,374,545 B2 | 6/2016 | Fowler et al. |

(Continued)

FOREIGN PATENT DOCUMENTS

| | | |
|---|---|---|
| EP | 1253781 B1 | 9/2004 |
| EP | 2093997 B1 | 12/2014 |

(Continued)

OTHER PUBLICATIONS

International Search Report, PCT/US23/82232, mailed May 1, 2024, 15 pages.

*Primary Examiner* — James M Hannett
*Assistant Examiner* — Fayez A Bhuiyan
(74) *Attorney, Agent, or Firm* — Panitch Schwarze Belisario & Nadel LLP

(57) ABSTRACT

Examples include an image sensor comprising a pixel array having at least one column of addressable pixel sensors, and a column amplifier coupled to the at least one column of addressable pixel sensors, the column amplifier comprising a transistor bank including a plurality of transistors, and mode select circuitry coupled to the transistor bank and configured to establish one or more connections among the plurality of transistors to configure the column amplifier to operate in one of a differential mode of operation and a single-ended mode of operation.

18 Claims, 6 Drawing Sheets

(56) References Cited

U.S. PATENT DOCUMENTS

| | | |
|---|---|---|
| 9,781,364 B2 | 10/2017 | Chenebaux |
| 9,942,502 B2 | 4/2018 | Borremans |
| 10,484,618 B1 | 11/2019 | Do et al. |
| 11,445,140 B2 | 9/2022 | Benjaram et al. |
| 2005/0185078 A1* | 8/2005 | Segura-Puchades .. H04N 25/78 |
| | | 348/E3.018 |
| 2008/0259193 A1 | 10/2008 | Toya et al. |
| 2009/0101798 A1 | 4/2009 | Yadid-Pecht et al. |
| 2013/0082936 A1 | 4/2013 | Islamkulov et al. |
| 2018/0249098 A1 | 8/2018 | Sakakibara et al. |
| 2019/0147825 A1 | 5/2019 | Tsuchi |
| 2022/0035506 A1 | 2/2022 | Zou |

FOREIGN PATENT DOCUMENTS

| | | |
|---|---|---|
| EP | 2210407 B1 | 10/2017 |
| EP | 3876523 A1 | 9/2021 |
| GB | 2400767 A | 10/2004 |
| WO | 2016191852 A1 | 12/2016 |

* cited by examiner

DUAL-MODE COLUMN AMPLIFIER

BACKGROUND

Image sensors, such as CMOS image sensors, are widely used for a number of different applications across a large portion of the electromagnetic spectrum. Many image sensor designs use a two-dimensional array of sensors to capture impinging light across a given area. Each sensor may be considered a single pixel of the sensor array, with the pixels arranged in any number of rows and columns. Each pixel sensor includes some form of photodetector as well as a readout circuit that converts the charge accumulated by the photodetector during the image exposure to a voltage that is readout by a readout amplifier shared by all of the pixel sensors in a column (and thus referred to as a column amplifier). The pixel sensors in each row are read out in parallel using the column amplifiers. While various solutions have been proposed to achieve an image sensor system with high dynamic range or very low noise, a number of non-trivial issues remain.

SUMMARY

Aspects and embodiments are directed to readout column amplifiers and methods for using the same. In particular, certain aspects are directed to a dual-mode column amplifier for use in an image sensor, the dual-mode column amplifier being configurable between a differential mode of operation and a single-ended mode of operation, as discussed in more detail below.

According to one embodiment, an image sensor comprises a pixel array having at least one column of addressable pixel sensors, and a column amplifier coupled to the at least one column of addressable pixel sensors, the column amplifier comprising a transistor bank including a plurality of transistors, and mode select circuitry coupled to the transistor bank and configured to establish one or more connections among the plurality of transistors to configure the column amplifier to operate in one of a differential mode of operation and a single-ended mode of operation.

Various examples of the image sensor may include any one or more of the following features.

In one example, the mode select circuitry comprises a plurality of switches, the plurality of switches including a first subset of switches and a second subset of switches, the second subset of switches being logical complements of the first subset of switches.

In another example, when the first subset of switches are in a closed position and the second subset of switches are in an open position, the column amplifier is configured into the differential mode of operation, and when the first subset of switches are in the open position and the second subset of switches are in the closed position, the column amplifier is configured into the single-ended mode of operation.

In another example, the plurality of transistors includes at least one pair of transistors, and the mode select circuitry is configured to connect together two transistors forming each pair of transistors of the at least one pair of transistors to configure the column amplifier into the single-ended mode of operation.

In another example, the plurality of transistors comprises a first transistor, a first chain of transistors coupled between a supply voltage node and the first transistor, and a second chain of transistors coupled between the supply voltage node and the first transistor.

In another example, to configure the column amplifier into the single-ended mode of operation, the mode select circuitry is configured to connect together pairs of transistors to form a third chain of transistors coupled between the supply voltage node and ground, each pair of transistors including one transistor from the first chain of transistors and a matching transistor from the second chain of transistors.

In another example, for each pair of transistors, the matching transistor from the second chain of transistors has a same size as the one transistor from the first chain of transistors.

In another example, the column amplifier is configured to receive an input voltage from the at least one column of addressable pixel sensors and to provide an output voltage based on the input voltage.

In one example, the image sensor further comprises an analog-to-digital converter (ADC) coupled to the column amplifier and configured to receive and digitize the output voltage to provide a digital signal, and a processor coupled to the ADC and configured to receive and process the digital signal.

In another example, the processor is further configured to provide a control input to the mode select circuitry to control the mode select circuitry to configure the column amplifier between the differential mode of operation and the single-ended mode of operation.

According to one embodiment, a column amplifier circuit comprises a first transistor coupled between a voltage supply terminal and a first node, the first transistor having a first control terminal coupled to a first input terminal, a second transistor coupled between an output terminal and the first node, the second transistor having a second control terminal coupled to a second input terminal, a third transistor coupled between the voltage supply terminal and the first transistor, the third transistor having a third control terminal, a fourth transistor coupled between the output terminal and the second transistor, the fourth transistor having a fourth control terminal coupled to the third control terminal of the third transistor, and a fifth transistor coupled between the first node and a ground, the fifth transistor having a fifth control terminal. The column amplifier circuit may further comprise switching circuitry including a first switch that selectively couples the first input terminal to the second input terminal, a second switch that selectively couples together a second node positioned between the first and third transistors and a third node positioned between the second transistor and the fourth transistor, a third switch that selectively couples the third transistor to the output terminal, a fourth switch that selectively couples the first node to the ground, and a first switching device that selectively couples the fifth control terminal of the fifth transistor between a first bias voltage terminal and the ground.

Various examples of the column amplifier circuit may include any one or more of the following features.

In one example, the first switching device includes a pair of fifth switches that are logical complements of one another.

In one example, the column amplifier circuit further comprises a sixth transistor coupled between the third transistor and the voltage supply terminal, the sixth transistor having a sixth control terminal, and a seventh transistor coupled between the output terminal and the voltage supply terminal, the seventh transistor having a seventh control terminal coupled to the sixth control terminal of the sixth transistor.

In another example, the column amplifier circuit further comprises an eighth transistor coupled between the sixth transistor and the voltage supply terminal, the eighth transistor having an eighth control terminal, and a ninth transistor coupled between the seventh transistor and the voltage supply terminal, the ninth transistor having a ninth control terminal coupled to the eighth control terminal of the eighth transistor.

In one example, the switching circuitry further comprises a second switching device that selectively couples the eighth and ninth control terminals of the eighth and ninth transistors, respectively, to one of a fourth node and a second bias voltage terminal, the fourth node being positioned between the third and sixth transistors, and a sixth switch that selectively couples a fifth node to a sixth node, the fifth node being positioned between the sixth and eighth transistors and the sixth node being positioned between the seventh and ninth transistors.

In one example, the second switching device includes a pair of seventh switches that are logical complements of one another.

In one example, the first, second, third, fourth, and sixth switches are configured to be actuated as a group between an open position and a closed position such that when the first switch is in the open position, the second, third, fourth and sixth switches are in the open position, and when the first switch is in the closed position, the second, third, fourth and sixth switches are in the closed position.

In another example, the first switching device is configured to couple the fifth control terminal of the fifth transistor to the ground when the first switch is in the closed position and to couple the fifth control terminal of the fifth transistor to the first bias voltage terminal when the first switch is in the open position, and the second switching device is configured to couple the eighth and ninth control terminals of the eighth and ninth transistors, respectively, to the fourth node when the first switch is in the open position, and to couple the eighth and ninth control terminals of the eighth and ninth transistors, respectively, to the second bias voltage terminal when the first switch is in the closed position.

In another example, the third and fourth control terminals of the third and fourth transistors, respectively, are coupled to a third bias voltage terminal, and sixth and seventh control terminals of the sixth and seventh transistors, respectively, are coupled to a fourth bias voltage terminal.

According to another embodiment, a column amplifier circuit comprises a first transistor having a first control terminal switchably coupled to one of a first bias voltage terminal and a ground, a first transistor chain coupled between a voltage supply terminal and a first node, the first node being switchably coupled to one of the first transistor and the ground, the first transistor chain including a second transistor coupled to first node, and a plurality of first chain transistors coupled between the second transistor and the voltage supply terminal, and a second transistor chain coupled between the voltage supply terminal and the first node, the second transistor chain including a third transistor coupled between the first node and an output terminal, and a plurality of second chain transistors coupled between the third transistor and the voltage supply terminal, wherein the second transistor has a second control terminal coupled to a first input terminal, wherein the third transistor has a third control terminal coupled to a second input terminal that is switchably coupled to the first input terminal, wherein each first chain transistor of the plurality of first chain transistors has a control terminal connected to a control terminal of a respective second chain transistor of the plurality of second chain transistors, and wherein the plurality of first chain transistors and the plurality of second chain transistors are switchably coupled together in pairs.

Still other aspects, embodiments, and advantages of these example aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

DETAILED DESCRIPTION

Figure 1:
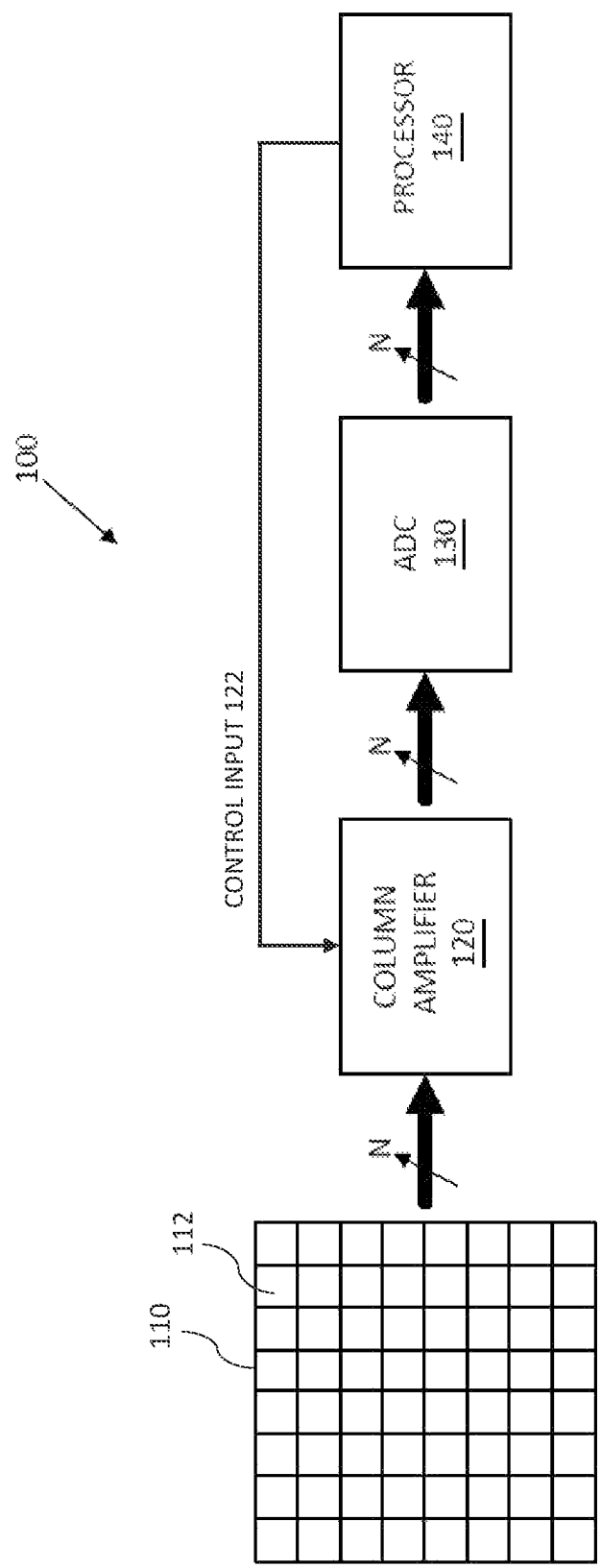
FIG. 1 is a block diagram of an example image sensor system that uses a pixel array and a column amplifier in accordance with aspects of the present disclosure.

Structures are disclosed for a column amplifier that is configurable between two modes of operation, namely, a differential mode and a single-ended mode. In an example, the column amplifier can be used with image sensors that include an array of photosensitive pixel sensors. The column amplifier can be selectively configured between the two different modes of operation to allow the image sensor to be adapted or optimized for different applications that may have different operational requirements. According to some such embodiments, the column amplifier is implemented using a transistor bank comprising two or more transistors, such as metal oxide semiconductor field effect transistors (MOSFETs) or other suitable transistor technology, and includes mode select circuitry that configures the column amplifier between the two operational modes based on a control input. In certain examples, the mode select circuitry includes one or more switches that control connections among the transistors in the transistor bank. Depending on the state(s) of the one or more switches, the column amplifier can be configured between a differential mode of operation and a single-ended mode of operation. This configurability of the column amplifier can allow the image sensor to be adapted to suit both imaging applications in which a differential amplifier architecture is desirable and those in which a single-ended amplifier architecture is desirable.

General Overview

As discussed above, there a number of non-trivial issues that remain with respect to image sensors. For example, some imaging applications may require a very wide dynamic range such as applications in which highly variable lighting conditions are encountered, while other imaging applications, such as photon counting applications, may require ultra-low noise. With respect to high dynamic range, one possible approach is to use a differential column amplifier to accommodate the fact that the polarity of the bit line voltage that is input to the column amplifier may change between an overflow charge phase (high light conditions) of the pixel sensor and a photodiode charge phase (low light conditions) of the pixel sensor. However, in other applications that require low noise and where the input voltage polarity does not change, it may be preferable to use a single-ended column amplifier rather than a differential amplifier, such as in the case of rolling shutter imaging mode applications or photon counting applications. With the same power consumption, a single-ended amplifier can reduce the read noise by about 15-20% compared to a differential amplifier. In the single-ended configuration, the amplifier current is not split into two parts, as it is in the differential case. By effectively doubling the current, the single-ended amplifier has a higher slew rate and lower thermal noise due to higher transconductance. A column amplifier with higher slew rate and transconductance can operate with a larger load capacitance at the same frame rate, and a larger load capacitance helps to reduce the read noise. Thus, there are some circumstances and applications in which a differential column amplifier provides benefits and may be preferred, and other circumstances and applications in which a single-ended column amplifier provides benefits and may be preferred.

Accordingly, techniques are disclosed herein for designing a column amplifier that can operate either as a differential amplifier for very wide dynamic range applications, for example, or as a single-ended amplifier for ultra low noise applications, for example. As discussed further below, the operational mode of the column amplifier may be switch selectable.

According to some embodiments, an image sensor includes a pixel array having at least one column of addressable pixel sensors, and a column amplifier coupled to the at least one column of addressable pixel sensors. The column amplifier may include a transistor bank that includes a plurality of transistors, and mode select circuitry coupled to the transistor bank. The mode select circuitry may be configured to establish one or more connections among the plurality of transistors so as to configure the column amplifier between a differential mode of operation and a single-ended mode of operation.

System Architecture

FIG. 1 is a block diagram of an example of an image sensor 100, according to some embodiments. The image sensor 100 may represent or be an integral part of a charge coupled device (CCD) camera or other type of imaging device. In some embodiments, the image sensor 100 may be configured for capturing different portions of the electromagnetic spectrum, such as visible light, ultraviolet radiation, infrared radiation, or x-rays, to name a few examples. The image sensor 100 may include a pixel array 110, a column amplifier 120, an analog-to-digital converter (ADC) 130, and a processor 140. Each of the illustrated components may be included together on same printed circuit board (PCB) or together in a single chip package (e.g., a system-in-package or system-on-chip). In some other embodiments, any one or more of the elements may be provided in a separate chip package and/or on separate PCBs.

According to some embodiments, the pixel array 110 includes a plurality of pixel sensors 112 arranged in a row-column format. Each pixel sensor 112 of the pixel array 110 may have a similar architecture that includes a photodetector and a readout circuit. The photo detection area of each pixel sensor on which incident radiation may impinge may vary from one embodiment to the next, but in some example cases has a physical size of around 1 µm×1 µm up to around 5 µm×5 µm. Likewise, the shape and lensing (if present) of the photo detection area (e.g., photo diode) can also vary from one example to the next, depending on factors such as desired fill factor of the array. According to some embodiments, each row of pixel sensors may be coupled together via a common row-select line (e.g., a wordline), to provide separately addressable rows of pixel sensors.

According to some embodiments, the outputs from N different columns of pixel sensors 112 are received by the column amplifier 120. According to some embodiments, the column amplifier 120 represents N separate column amplifiers with a given column amplifier configured to receive the output from a corresponding column of pixel sensors from the pixel array 110. In this way, a given row of pixel sensors from the pixel array 110 can be selected via a row-select line and simultaneously read out via the N column amplifiers 120. According to some embodiments, the column amplifier 120 may include any type of amplifier configuration, such as any number of source follower FETs or operational amplifiers. In some embodiments, a single column amplifier 120 may be used in conjunction with a multiplexer to receive each of the N column outputs from the pixel array 110.

According to some embodiments, the output(s) from the column amplifier 120 is/are received by the ADC 130. As noted above, the ADC 130 may represent N different ADCs with a given ADC configured to receive the output from a corresponding column amplifier 120. The ADC 130 may be any known type of ADC without limitation.

The processor 140 may be configured to receive the digitized signal from the ADC 130 (or N digitized signals across N ADCs) and perform any number of operations with the signal(s). For example, the processor 140 may receive the signal data from a given row of pixel sensors of the pixel array 110 and use the signal data to create an image or a portion of an image captured via the pixel array 110. According to some embodiments, the processor 140 may provide a control input 122 to the column amplifier to change an operating mode of the amplifier, as discussed further below. As used herein, the term "processor" may refer to any device or portion of a device that processes electronic data from registers and/or memory to transform that electronic data into other electronic data that may be stored in registers and/or memory. The processor 140 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, custom-built semiconductor, or any other suitable processing devices.

Column Amplifier Design

Figure 2:
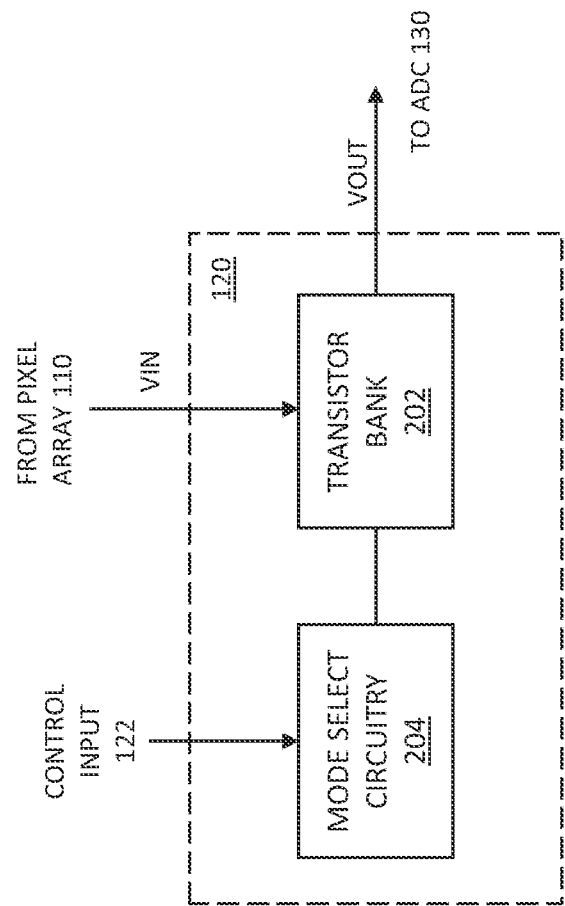
FIG. 2 is a block diagram of an example column amplifier according to aspects of the present disclosure.

FIG. 2 illustrates a block diagram of one example of a column amplifier 120 according to some embodiments. The column amplifier 120 may include a transistor bank 202 and mode select circuitry 204 that is coupled to the transistor bank 202. The transistor bank 202 may include two or more transistors, which may be any type of transistors, such as FETs, e.g., MOSFETs, or other types of transistors. The transistor bank 202 is configured to readout a voltage from one or more columns of pixel sensors 112 in the pixel array 110. Thus, the transistor bank 202 receives an input voltage, $V_{IN}$, from the pixel array 110 and provides an output voltage, $V_{OUT}$, that can be supplied to the ADC 130, for example. In examples in which the column amplifier 120 is configured in the differential mode, the input voltage, $V_{IN}$, represents a differential input, as discussed further below. Likewise, in examples in which the column amplifier 120 is configured in the single input mode, the input voltage, $V_{IN}$, represents a single input, as discussed further below.

According to some embodiments, the mode select circuitry 204 is configured to control connections between the two or more transistors in the transistor bank 202 in order to configure the column amplifier 120 in either one of the differential and single-ended modes of operation, at a given point in time. In some examples, the mode select circuitry 204 includes one or more switches that make and break connections among the transistors in the transistor bank 202 and thereby change the configuration and operating mode of the column amplifier 120. The state(s) of the switches may be controlled by a control input 122. In some examples, the control input 122 may be provided by the processor 140 as discussed above and illustrated in FIG. 1. However, in other examples, the control input may be provided by another component that may be part of the image sensor 100 or external to the image sensor 100.

The column amplifier 120 may include other components, such as one or resistors and/or capacitors, for example, not shown in FIG. 2 and that may be used to allow the column amplifier to produce a desired output voltage, $V_{OUT}$.

Figure 3:
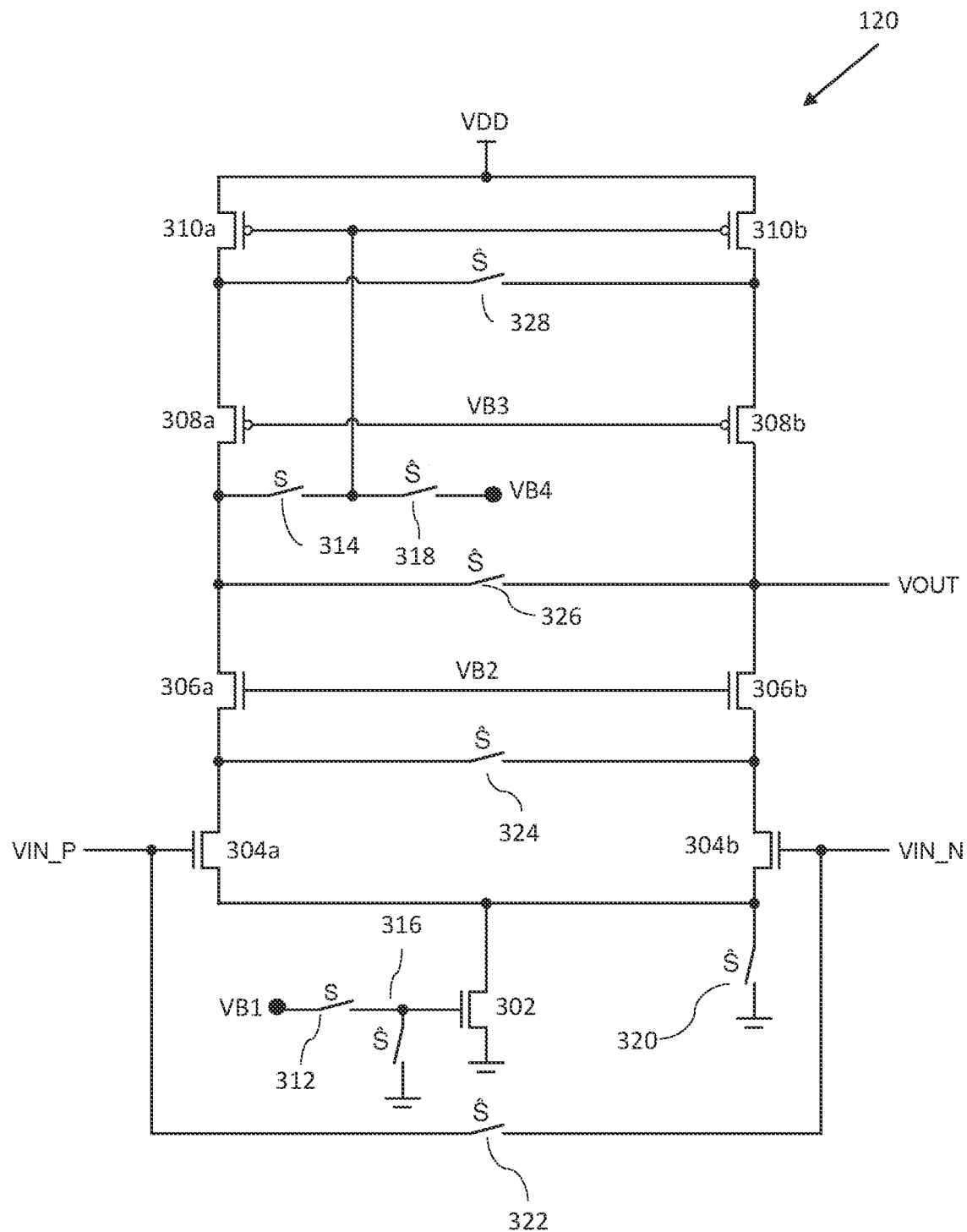
FIG. 3 is a circuit diagram of an example dual-mode column amplifier according to aspects of the present disclosure.

FIG. 3 illustrates a circuit diagram of one example implementation of the column amplifier 120, according to an embodiment. In this example, the transistor bank 202 includes a first transistor 302 and four pairs of transistors, namely a first pair 304a and 304b, a second pair 306a and 306b, a third pair 308a and 308b, and a fourth pair 310a and 310b. Other examples of the column amplifier 120 may include more or fewer than four pairs of transistors. Each of the transistors 302, 304a, 304b, 306a, 306b, 308a, 308b, 310a, 310b may be a field effect transistor (FET), for example, and may be either a p-doped or n-doped metal oxide semiconductor device (PMOS or NMOS). In other example embodiments, any of the FETs can be replaced with other transistor technologies, such as a bipolar junction transistor (BJT). Bias voltages VB1, VB2, VB3, and VB4 are applied to the control terminals (gates) of the first transistor 302, the second pair of transistors 306a and 306b, the third pair of transistors 308a and 308b, and the fourth pair of transistors 310a and 310b, respectively, as shown in FIG. 3.

In some examples, the two transistors in each pair of transistors 304a and 304b, 306a and 306b, 308a and 308b, and 310a and 310b may be the same (e.g., with respect to factors such as size, threshold voltage, and type). For example, the two transistors in each pair of transistors 304a and 304b, 306a and 306b, 308a and 308b, and 310a and 310b may have the same size, within a reasonable tolerance (e.g., length and width are each within 5% of a respective target length and width). In more detail, each transistor 302, 304a, 304b, 306a, 306b, 308a, 308b, 310a, 310b may have a size that is described by a ratio (W/L) of the width (W) of the transistor to the length (L) of the gate of the transistor. The length (L) of each transistor corresponds to the distance between source and drain of that transistor, and the width (W) corresponds to the extension of the transistor in the direction perpendicular to the length (L). In one example, the first transistor 302 has a first size $(W/L)_1$, the transistors 304a and 304b in the first pair each have a second size $(W/L)_2$, the transistors 306a and 306b in the second pair each have a third size $(W/L)_3$, the transistors 308a and 308b in the third pair each have a fourth size $(W/L)_4$, and the transistors 310a and 310b in the fourth pair each have a fifth size $(W/L)_5$. In some examples, each of the sizes $(W/L)_1$, $(W/L)_2$, $(W/L)_3$, $(W/L)_4$, and $(W/L)_5$ are different. In other examples, one or more of the sizes $(W/L)_1$, $(W/L)_2$, $(W/L)_3$, $(W/L)_4$, and $(W/L)_5$ may be the same (within an acceptable tolerance). The sizes $(W/L)_1$, $(W/L)_2$, $(W/L)_3$, $(W/L)_4$, and $(W/L)_5$ of the respective transistors may be selected based on various factors, such as a desired level of amplification to be provided by the column amplifier and/or other desired characteristics of the output voltage, VOLT, and/or performance of the column amplifier.

According to some embodiments, the mode select circuitry 204 includes a plurality of switches, S and Ŝ. The switches Ŝ are logical complements of the switches S. That is, when the switches S are open, the switches Ŝ are necessarily closed, and vice versa. In some examples, the switches S and Ŝ can be set to either a HIGH state (e.g., with a voltage corresponding to VDD) or a LOW state (e.g., with a voltage corresponding to 0V or ground). In one example, the HIGH state corresponds to the switch being closed and the LOW state corresponds to the switch being open; however, in other examples, the circuit may be configured with the opposite condition (i.e., the HIGH state corresponding to the switch being open and the LOW state corresponding to the switch being closed). The switches S and Ŝ may be coupled to a control line (not shown in FIG. 3) such that the control input 122 simultaneously sets all the switches S to one state and all the switches Ŝ to the opposite state. Accordingly, by changing the control input 122, the switches S and Ŝ can be toggled between being open and being closed, and thereby configured the column amplifier 120 between the differential mode and the single-ended mode.

In the example illustrated in FIG. 3, the plurality of switches, S, includes a first switch 312 positioned to selectively connect and disconnect the gate of the first transistor 302 with a node supplying the first bias voltage, VB1, and a second switch 314 positioned to selectively couple and decouple the drains of transistors 308a and 306a to the gates of the fourth pair of transistors 310a and 310b. The plurality of switches S includes a third switch 316 that selectively connects and disconnects the gate of the first transistor 302 to ground. Thus, the complementary actions of the first switch 312 and the third switch 316 selectively couple the gate of the first transistor 302 to either the bias voltage VB1 or ground. In some examples, the pair of switches 312 and 316 may be replaced with a single-pole, double-throw switch that selectively couples the gate of the first transistor 302 to either the bias voltage VB1 or ground. The plurality of switches $ further includes a fourth switch 318 that selectively connects and disconnects the gates of the fourth pair of transistors 310a, 310b to a node supplying the fourth bias voltage, VB4, and a fifth switch 320 that selectively couples and decouples the sources/drain of the transistors 304a, 304b, and 302, respectively, to ground. The plurality of switches S further includes a sixth switch 322 that operates to selectively split the input voltage, $V_{IN}$, received from the pixel array 110 into two parts, $V_{IN\_P}$, $V_{IN\_N}$, as discussed further below with reference to FIG. 4. The plurality of switches Ŝ further includes three switches 324, 326, 328 that selectively connect together the two transistors in each of the pairs of transistors as discussed further below with reference to FIG. 5.

Figure 4:
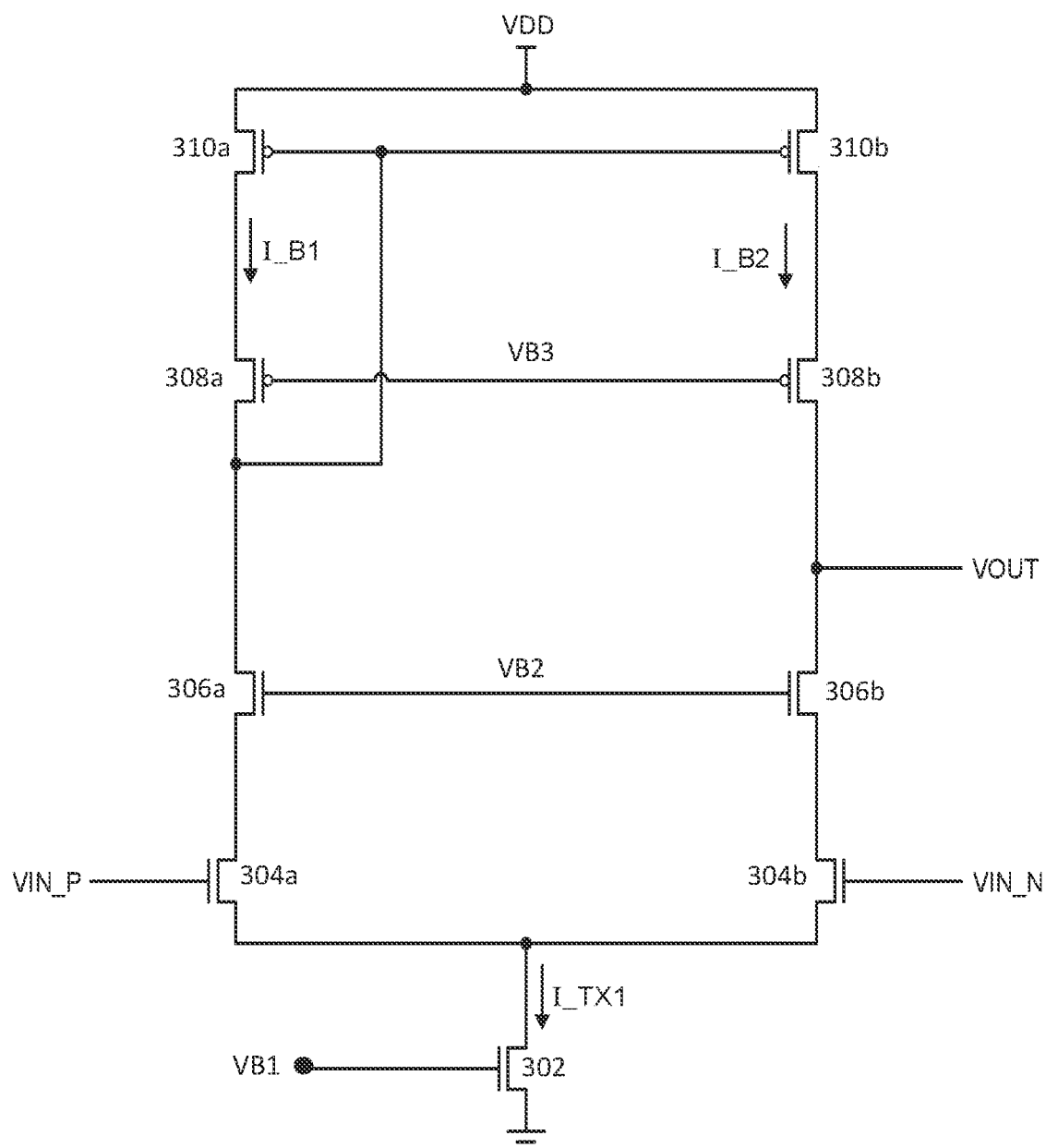
FIG. 4 illustrates an effective circuit of the example column amplifier of FIG. 3 when configured in a differential mode of operation according to aspects of the present disclosure.

Referring to FIGS. 3 and 4, according to some embodiments, to configure the column amplifier 120 into the differential mode (shown in FIG. 4), the switches S are closed (e.g., set to the HIGH state) and the switches Ŝ are open (e.g., set to the LOW state). Thus, the column amplifier is configured as a differential amplifier with transistors 304a, 306a, 308a, and 310a forming a first branch and transistors 304b, 306b, 308b, and 310b forming a second branch. With the switch 322 open, the input voltage, $V_{IN}$, received from the pixel array 110 is a differential voltage including a first part, $V_{IN}$ P applied at the gate of the transistor 304a and a second part $V_{IN}$ N, applied at the gate of the transistor 304b, as shown in FIG. 4. In the differential mode, the current I_TX1 flowing through the first transistor 302 is twice in comparison to the currents I_B1 and I_B2 flowing in each of the branches of the differential amplifier, assuming transistors 304a, 306a, 308a, and 310a are substantially the same as transistors 304b, 306b, 308b, and 310b, thus reducing any asymmetries in current flowing through the first and second branches. For example, if the current I_TX1 is about 15 microamperes (μA), then the two branch currents, I_B1 and I_B2, are each about 7.5 μA. Again, reasonable tolerances can be assigned to the various transistor parameters (e.g., L/W, source-to-drain on resistance, threshold voltage) and precise equality of the branches is not necessarily needed. Other embodiments may utilize asymmetry of the first and second branches.

Figure 5:
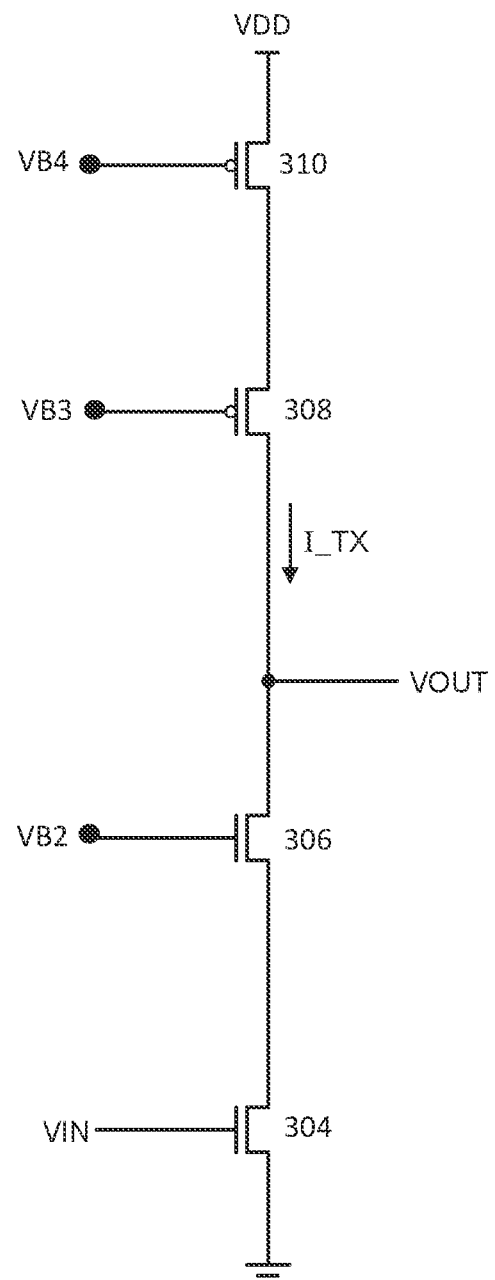
FIG. 5 illustrates an effective circuit of the example column amplifier of FIG. 3 when configured in a single-ended mode of operation according to aspects of the present disclosure.

Referring to FIGS. 3 and 5, according to some embodiments, to configure the column amplifier 120 into the single-ended mode (shown in FIG. 5), the states of the switches S and Ŝ are reversed. That is, the switches S are open (e.g., set to the LOW state) and the switches Ŝ are closed (e.g., set to the HIGH state). In this case, with the three switches 324, 326, and 328 (FIG. 3) closed, the transistors in each of the four pairs are coupled together and as such, each pair acts as a single transistor that is double in size relative to the individual transistors of the pair. Thus, referring to FIGS. 3 and 5, in the single-ended mode of FIG. 5, the transistors 304a and 304b of the first pair become transistor 304, the transistors 306a and 306b of the second pair become transistor 306, the transistors 308a and 308b of the third pair become transistor 308, and the transistors 310a and 310b of the fourth pair become transistor 310. Transistor 304 has a size $2(W/L)_2$, transistor 306 has a size $2(W/L)_3$, transistor 308 has a size $2(W/L)_4$, and transistor 310 has a size $2(W/L)_5$. In addition, the current, I_TX, flowing through the transistors 304, 306, 308, and 310 is doubled relative to the branch currents, I_B1 and I_B2, and the same as the current, I_TX1, in the differential configuration of FIG. 4. In this example, because the transistor sizes and currents are doubled relative to the differential mode, the column amplifier 120 in the single-ended mode has a higher transconductance and slew rate than it does in the differential mode (with the same power consumption). Therefore, in the single-ended mode, the column amplifier 120 may operate with a larger load capacitance, at the same frame rate, in order to reduce the read noise. In some examples, for rolling shutter mode applications of the image sensor 100, the column amplifier 120 may help to reduce the read noise by about 15% by using the single-ended configuration.

Thus, aspects and embodiments provide a multi-mode configurable column amplifier that can be switched between a differential mode/configuration and a single-ended mode/configuration, and thereby provide a more flexible, high performance image sensor that can be used for both very wide dynamic range and ultra-low noise applications. For example, as discussed above, when the image sensor 100 is used for very wide dynamic range applications, the column amplifier 120 can be configured to operates as a differential amplifier, and when the image sensor 100 is used for ultra-low noise applications, the column amplifier 120 can be configured to operate as a single-ended amplifier.

Example Computing Platform

Figure 6:
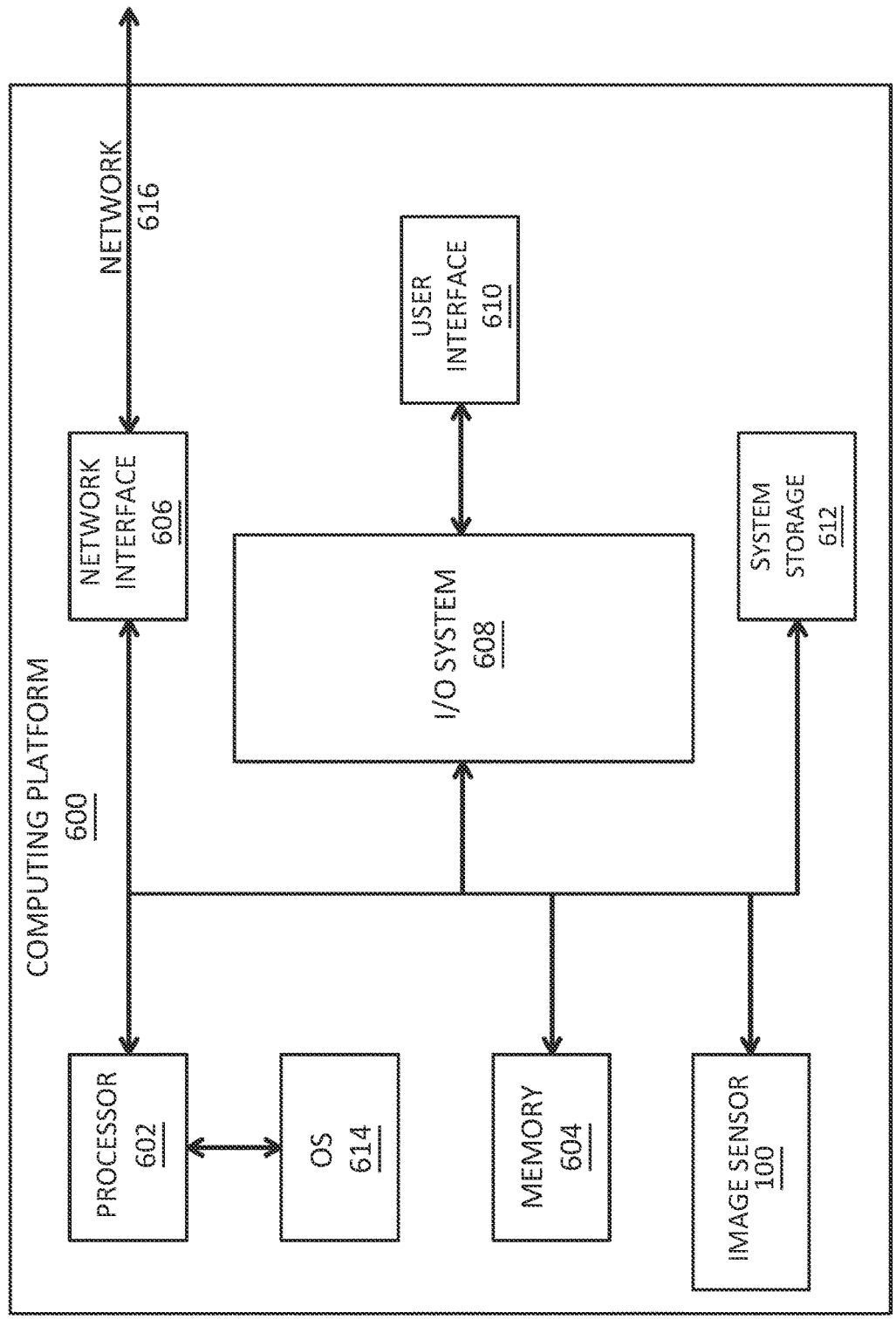
FIG. 6 is a block diagram of one example of a computing platform that includes the example image sensor of FIG. 1, in accordance with aspects of the present disclosure.

FIG. 6 illustrates an example computing platform 600 that interfaces with image sensor 100, configured in accordance with certain embodiments of the present disclosure. In some embodiments, computing platform 600 may host, or otherwise be incorporated into a personal computer, workstation, server system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, imaging device, wearable device, embedded system, and so forth. Any combination of different devices may be used in certain embodiments. The computing platform 600 may host a controlled area network (CAN) used on board a vehicle. In some embodiments, the computing platform 600 represents one system in a network of systems coupled together via a CAN bus.

In some examples, the computing platform 600 may comprise any combination of a processor 602, a memory 604, an embodiment of the image sensor 100, a network interface 606, an input/output (I/O) system 608, a user interface 610, and a storage system 612. In some embodiments, one or more components of the image sensor 100 are implemented as part of the processor 602. As shown in FIG. 6, a bus and/or interconnect is also provided to allow for communication between the various components listed above and/or other components not shown. The computing platform 600 can be coupled to a network 616 through the network interface 606 to allow for communications with other computing devices, platforms, or resources. Other componentry and functionality not reflected in the block diagram of FIG. 6 will be apparent in light of this disclosure, and it will be appreciated that other embodiments are not limited to any particular hardware configuration.

The processor 602 can be any suitable processor and may include one or more coprocessors or controllers to assist in control and processing operations associated with the computing platform 600. In some embodiments, the processor 602 may be implemented as any number of processor cores. The processor (or processor cores) may be any type of processor, such as, for example, a micro-processor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core. In some examples, the processor 602 may include, or may be part of, the processor 140 discussed above.

The memory 604 can be implemented using any suitable type of digital storage including, for example, flash memory and/or random access memory (RAM). In some embodiments, the memory 604 may include various layers of memory hierarchy and/or memory caches. The memory 604 may be implemented as a volatile memory device such as, but not limited to, a RAM, dynamic RAM (DRAM), or static RAM (SRAM) device. The storage system 612 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, the storage system 612 may comprise technology to increase the storage performance enhanced protection for valuable digital media when multiple hard drives are included.

The processor 602 may be configured to execute an Operating System (OS) 614 which may comprise any suitable operating system, such as Google Android (Google Inc., Mountain View, CA), Microsoft Windows (Microsoft Corp., Redmond, WA), Apple OS X (Apple Inc., Cupertino, CA), Linux, or a real-time operating system (RTOS). As will be appreciated in light of this disclosure, the techniques provided herein can be implemented without regard to the particular operating system provided in conjunction with the computing platform 600, and therefore may also be implemented using any suitable existing or subsequently-developed platform.

The network interface 606 can be any appropriate network chip or chipset which allows for wired and/or wireless connection between other components of the computing platform 600 and/or the network 616, thereby enabling the computing platform 600 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

The I/O system 608 may be configured to interface between various I/O devices and other components of the computing platform 600. I/O devices may include, but not be limited to, a user interface 610. The user interface 610 may include devices (not shown) such as a display element, touchpad, keyboard, mouse, and speaker, etc. The I/O system 608 may include a graphics subsystem configured to perform processing of images for rendering on a display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into the processor 602 or any chipset of the computing platform 600.

It will be appreciated that in some embodiments, the various components of the computing platform 600 may be combined or integrated in a system-on-a-chip (SoC) architecture. In some embodiments, the components may be hardware components, firmware components, software components or any suitable combination of hardware, firmware or software.

In various embodiments, the computing platform 600 may be implemented as a wireless system, a wired system, or a combination of both. When implemented as a wireless system, the computing platform 600 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, the computing platform 600 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., non-volatile) in memory devices. The circuitry may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Other embodiments may be implemented as software executed by a programmable control device. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, GPUs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

ADDITIONAL EXAMPLES

Example 1 is an image sensor comprising a pixel array having at least one column of addressable pixel sensors, and a column amplifier coupled to the at least one column of addressable pixel sensors, the column amplifier comprising a transistor bank including a plurality of transistors, and mode select circuitry coupled to the transistor bank and configured to establish one or more connections among the plurality of transistors to configure the column amplifier to operate in one of a differential mode of operation and a single-ended mode of operation.

Example 2 includes the image sensor of Example 1, wherein the mode select circuitry comprises a plurality of switches, the plurality of switches including a first subset of switches and a second subset of switches, the second subset of switches being logical complements of the first subset of switches.

Example 3 includes the image sensor of Example 2, wherein when the first subset of switches are in a closed position and the second subset of switches are in an open position, the column amplifier is configured into the differential mode of operation, and when the first subset of switches are in the open position and the second subset of switches are in the closed position, the column amplifier is configured into the single-ended mode of operation.

Example 4 includes the image sensor of any one of Examples 1-3, wherein the plurality of transistors includes at least one pair of transistors, and wherein the mode select circuitry is configured to connect together two transistors forming each pair of transistors of the at least one pair of transistors to configure the column amplifier into the single-ended mode of operation.

Example 5 includes the image sensor of any one of Examples 1-3, wherein the plurality of transistors comprises a first transistor, a first chain of transistors coupled between a supply voltage node and the first transistor, and a second chain of transistors coupled between the supply voltage node and the first transistor.

Example 6 includes the image sensor of Example 5, wherein, to configure the column amplifier into the single-ended mode of operation, the mode select circuitry is configured to connect together pairs of transistors to form a third chain of transistors coupled between the supply voltage node and a ground node, each pair of transistors including one transistor from the first chain of transistors and a matching transistor from the second chain of transistors.

Example 7 includes the image sensor of Example 6, wherein for each pair of transistors, the matching transistor from the second chain of transistors has a same size as the one transistor from the first chain of transistors.

Example 8 includes the image sensor of any one of Examples 1-7, wherein the column amplifier is configured to receive an input voltage from the at least one column of addressable pixel sensors and to provide an output voltage based on the input voltage.

Example 9 includes the image sensor of Example 8, further comprising an analog-to-digital converter (ADC) coupled to the column amplifier and configured to receive and digitize the output voltage to provide a digital signal, and a processor coupled to the ADC and configured to receive and process the digital signal.

Example 10 includes the image sensor of Example 9, wherein the processor is further configured to provide a control input to the mode select circuitry to control the mode select circuitry to configure the column amplifier between the differential mode of operation and the single-ended mode of operation.

Example 11 is a column amplifier circuit that comprises a first transistor coupled between a voltage supply terminal and a first node, the first transistor having a first control terminal coupled to a first input terminal, a second transistor coupled between an output terminal and the first node, the second transistor having a second control terminal coupled to a second input terminal, and a third transistor coupled between the voltage supply terminal and the first transistor, the third transistor having a third control terminal. The column amplifier circuit of Example 11 further comprises a fourth transistor coupled between the output terminal and the second transistor, the fourth transistor having a fourth control terminal coupled to the third control terminal of the third transistor; a fifth transistor coupled between the first node and a ground terminal, the fifth transistor having a fifth control terminal, and switching circuitry including a first switch that selectively couples the first input terminal to the second input terminal, a second switch that selectively couples together a second node positioned between the first and third transistors and a third node positioned between the second transistor and the fourth transistor, a third switch that selectively couples the third transistor to the output terminal, a fourth switch that selectively couples the first node to the ground terminal, a first switching device that selectively couples the fifth control terminal of the fifth transistor between a first bias voltage terminal and the ground terminal.

Example 12 includes the column amplifier circuit of Example 11, wherein the first switching device includes a pair of fifth switches that are logical complements of one another.

Example 13 includes the column amplifier circuit of Example 12, further comprising a sixth transistor coupled between the third transistor and the voltage supply terminal, the sixth transistor having a sixth control terminal; and a seventh transistor coupled between the output terminal and the voltage supply terminal, the seventh transistor having a seventh control terminal coupled to the sixth control terminal of the sixth transistor.

Example 14 includes the column amplifier circuit of Example 13, further comprising an eighth transistor coupled between the sixth transistor and the voltage supply terminal, the eighth transistor having an eighth control terminal; and a ninth transistor coupled between the seventh transistor and the voltage supply terminal, the ninth transistor having a ninth control terminal coupled to the eighth control terminal of the eighth transistor.

Example 15 includes the column amplifier circuit of Example 14, wherein the switching circuitry further comprises a second switching device that selectively couples the eighth and ninth control terminals of the eighth and ninth transistors, respectively, to one of a fourth node and a second bias voltage terminal, the fourth node being positioned between the third and sixth transistors; and a sixth switch that selectively couples a fifth node to a sixth node, the fifth node being positioned between the sixth and eighth transistors and the sixth node being positioned between the seventh and ninth transistors.

Example 16 includes the column amplifier circuit of Example 15, wherein the second switching device includes a pair of seventh switches that are logical complements of one another.

Example 17 includes the column amplifier circuit of one of Examples 15 and 16, wherein the first, second, third, fourth, and sixth switches are configured to be actuated as a group between an open position and a closed position such that when the first switch is in the open position, the second, third, fourth and sixth switches are in the open position, and when the first switch is in the closed position, the second, third, fourth and sixth switches are in the closed position.

Example 18 includes the column amplifier circuit of Example 17, wherein the first switching device is configured to couple the fifth control terminal of the fifth transistor to the ground terminal when the first switch is in the closed position and to couple the fifth control terminal of the fifth transistor to the first bias voltage terminal when the first switch is in the open position; and wherein the second switching device is configured to couple the eighth and ninth control terminals of the eighth and ninth transistors, respectively, to the fourth node when the first switch is in the open position, and to couple the eighth and ninth control terminals of the eighth and ninth transistors, respectively, to the second bias voltage terminal when the first switch is in the closed position.

Example 19 includes the column amplifier circuit of Example 18, wherein the third and fourth control terminals of the third and fourth transistors, respectively, are coupled to a third bias voltage terminal, and wherein sixth and seventh control terminals of the sixth and seventh transistors, respectively, are coupled to a fourth bias voltage terminal.

Example 20 is a column amplifier circuit comprising a first transistor having a first control terminal switchably coupled to one of a first bias voltage terminal and a ground terminal, and a first transistor chain coupled between a voltage supply terminal and a first node, the first transistor chain including a second transistor coupled to first node, and a plurality of first chain transistors coupled between the second transistor and the voltage supply terminal. The column amplifier circuit of Example 20 further comprises a first switch configured to selectively couple the first node to the ground terminal, and a second transistor chain coupled between the voltage supply terminal and the first node, the second transistor chain including a third transistor coupled between the first node and an output terminal, and a plurality of second chain transistors coupled between the third transistor and the voltage supply terminal, wherein the second transistor has a second control terminal coupled to a first input terminal, wherein the third transistor has a third control terminal coupled to a second input terminal that is switchably coupled to the first input terminal, wherein each first chain transistor of the plurality of first chain transistors has a control terminal connected to a control terminal of a respective second chain transistor of the plurality of second chain transistors, and wherein the plurality of first chain transistors and the plurality of second chain transistors are switchably coupled together in pairs.

Example 21 includes the column amplifier of Example 20, further comprising a second switch that selectively couples together the first and second input terminals.

As will be appreciated in light of this disclosure, modifications are possible in the described embodiments, and other embodiments are possible, within the scope of the claims.

What is claimed is:

1. An image sensor comprising:
   a pixel array having at least one column of addressable pixel sensors; and
   a column amplifier coupled to the at least one column of addressable pixel sensors, the column amplifier comprising a transistor bank including a plurality of transistors, and mode select circuitry coupled to the transistor bank and configured to establish one or more connections among the plurality of transistors to configure the column amplifier to operate in one of a differential mode of operation and a single-ended mode of operation;
   wherein the mode select circuitry comprises a plurality of switches, the plurality of switches including a first subset of switches and a second subset of switches, the second subset of switches being logical complements of the first subset of switches; and
   wherein when the first subset of switches are in a closed position and the second subset of switches are in an open position, the column amplifier is configured into the differential mode of operation, and when the first subset of switches are in the open position and the second subset of switches are in the closed position, the column amplifier is configured into the single-ended mode of operation.

2. The image sensor of claim 1, wherein the plurality of transistors includes at least one pair of transistors, and wherein the mode select circuitry is configured to connect together two transistors forming each pair of transistors of the at least one pair of transistors to configure the column amplifier into the single-ended mode of operation.

3. The image sensor of claim 1, wherein the plurality of transistors comprises a first transistor, a first chain of transistors coupled between a supply voltage node and the first transistor, and a second chain of transistors coupled between the supply voltage node and the first transistor.

4. The image sensor of claim 3, wherein, to configure the column amplifier into the single-ended mode of operation, the mode select circuitry is configured to connect together pairs of transistors to form a third chain of transistors coupled between the supply voltage node and a ground node, each pair of transistors including one transistor from the first chain of transistors and a matching transistor from the second chain of transistors.

5. The image sensor of claim 4, wherein for each pair of transistors, the matching transistor from the second chain of transistors has a same size as the one transistor from the first chain of transistors.

6. The image sensor of claim 1, wherein the column amplifier is configured to receive an input voltage from the at least one column of addressable pixel sensors and to provide an output voltage based on the input voltage.

7. The image sensor of claim 6, further comprising:
an analog-to-digital converter (ADC) coupled to the column amplifier and configured to receive and digitize the output voltage to provide a digital signal; and
a processor coupled to the ADC and configured to receive and process the digital signal.

8. The image sensor of claim 7, wherein the processor is further configured to provide a control input to the mode select circuitry to control the mode select circuitry to configure the column amplifier between the differential mode of operation and the single-ended mode of operation.

9. A column amplifier circuit comprising:
a first transistor coupled between a voltage supply terminal and a first node, the first transistor having a first control terminal coupled to a first input terminal;
a second transistor coupled between an output terminal and the first node, the second transistor having a second control terminal coupled to a second input terminal;
a third transistor coupled between the voltage supply terminal and the first transistor, the third transistor having a third control terminal;
a fourth transistor coupled between the output terminal and the second transistor, the fourth transistor having a fourth control terminal coupled to the third control terminal of the third transistor;
a fifth transistor coupled between the first node and a ground terminal, the fifth transistor having a fifth control terminal; and
switching circuitry including
a first switch that selectively couples the first input terminal to the second input terminal,
a second switch that selectively couples together a second node positioned between the first and third transistors and a third node positioned between the second transistor and the fourth transistor,
a third switch that selectively couples the third transistor to the output terminal,
a fourth switch that selectively couples the first node to the ground terminal, and
a first switching device that selectively couples the fifth control terminal of the fifth transistor between a first bias voltage terminal and the ground terminal.

10. The column amplifier circuit of claim 9, wherein the first switching device includes a pair of fifth switches that are logical complements of one another.

11. The column amplifier circuit of claim 10, further comprising:
a sixth transistor coupled between the third transistor and the voltage supply terminal, the sixth transistor having a sixth control terminal; and
a seventh transistor coupled between the output terminal and the voltage supply terminal, the seventh transistor having a seventh control terminal coupled to the sixth control terminal of the sixth transistor.

12. The column amplifier circuit of claim 11, further comprising:
an eighth transistor coupled between the sixth transistor and the voltage supply terminal, the eighth transistor having an eighth control terminal; and
a ninth transistor coupled between the seventh transistor and the voltage supply terminal, the ninth transistor having a ninth control terminal coupled to the eighth control terminal of the eighth transistor.

13. The column amplifier circuit of claim 12, wherein the switching circuitry further comprises:
a second switching device that selectively couples the eight and ninth control terminals of the eighth and ninth transistors, respectively, to one of a fourth node and a second bias voltage terminal, the fourth node being positioned between the third and sixth transistors; and
a sixth switch that selectively couples a fifth node to a sixth node, the fifth node being positioned between the sixth and eighth transistors and the sixth node being positioned between the seventh and ninth transistors.

14. The column amplifier circuit of claim 13, wherein the second switching device includes a pair of seventh switches that are logical complements of one another.

15. The column amplifier of claim 13, wherein the first, second, third, fourth, and sixth switches are configured to be actuated as a group between an open position and a closed position such that when the first switch is in the open position, the second, third, fourth and sixth switches are in the open position, and when the first switch is in the closed position, the second, third, fourth and sixth switches are in the closed position.

16. The column amplifier circuit of claim 15, wherein the first switching device is configured to couple the fifth control terminal of the fifth transistor to the ground terminal when the first switch is in the closed position and to couple the fifth control terminal of the fifth transistor to the first bias voltage terminal when the first switch is in the open position; and
wherein the second switching device is configured to couple the eighth and ninth control terminals of the eighth and ninth transistors, respectively, to the fourth node when the first switch is in the open position, and to couple the eighth and ninth control terminals of the eighth and ninth transistors, respectively, to the second bias voltage terminal when the first switch is in the closed position.

17. The column amplifier circuit of claim 16, wherein the third and fourth control terminals of the third and fourth transistors, respectively, are coupled to a third bias voltage terminal; and
wherein sixth and seventh control terminals of the sixth and seventh transistors, respectively, are coupled to a fourth bias voltage terminal.

18. A column amplifier circuit comprising:
a first transistor having a first control terminal switchably coupled to one of a first bias voltage terminal and a ground terminal;
a first transistor chain coupled between a voltage supply terminal and a first node, the first transistor chain including a second transistor coupled to first node, and a plurality of first chain transistors coupled between the second transistor and the voltage supply terminal, wherein the second transistor has a has a second control terminal coupled to a first input terminal;
a first switch configured to selectively couple the first node to the ground terminal; and
a second transistor chain coupled between the voltage supply terminal and the first node, the second transistor chain including a third transistor coupled between the first node and an output terminal, and a plurality of second chain transistors coupled between the third transistor and the voltage supply terminal,
wherein the third transistor has a third control terminal coupled to a second input terminal that is switchably coupled to the first input terminal,
wherein each first chain transistor of the plurality of first chain transistors has a control terminal connected to a control terminal of a respective second chain transistor of the plurality of second chain transistors, and wherein the plurality of first chain transistors and the plurality of second chain transistors are switchably coupled together in pairs.

* * * * *